(12) United States Patent
Yang et al.

(10) Patent No.: US 6,602,747 B1
(45) Date of Patent: Aug. 5, 2003

(54) METHOD FOR FABRICATING BIPOLAR COMPLEMENTARY METAL OXIDE SEMICONDUCTOR (BiCMOS) DEVICE STRUCTURE

(75) Inventors: Fu-Chih Yang, Fengshan (TW); Guan-Jie Shen, Hualien (TW); Yung-Yen Shieh, Jungli (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/180,275

(22) Filed: Jun. 26, 2002

(51) Int. Cl.[7] ......................................... H01L 21/8238
(52) U.S. Cl. .................. 438/202; 438/350; 438/369; 438/532
(58) Field of Search ................. 438/202, 207, 438/208, 234, 350, 369, 532, 533, 919

(56) References Cited

U.S. PATENT DOCUMENTS

| | | | |
|---|---|---|---|
| 5,071,778 A | * 12/1991 | Solheim | 438/350 |
| 5,100,824 A | * 3/1992 | Vora | 438/207 |
| 5,453,389 A | * 9/1995 | Strain et al. | 438/532 |
| 5,557,131 A | 9/1996 | Lee | 438/207 |
| 5,661,046 A | 8/1997 | Ilderem | 438/202 |
| 6,281,060 B1 | * 8/2001 | Igarashi et al. | 438/202 |

\* cited by examiner

*Primary Examiner*—Chandra Chaudhari
(74) *Attorney, Agent, or Firm*—Tung & Associates

(57) ABSTRACT

Within both a method for fabricating a bipolar transistor device and a method for fabricating a BiCMOS device there is: (1) formed contacting a base contact region a polysilicon base contact of a second polarity; and (2) formed contacting an emitter contact region a polysilicon emitter contact of a first polarity. Within the methods, there is then implanted into the polysilicon base contact a dose of a dopant of the second polarity while masking the polysilicon emitter contact. The methods provide for enhanced performance of the bipolar transistor device and the BiCMOS device.

14 Claims, 2 Drawing Sheets

METHOD FOR FABRICATING BIPOLAR COMPLEMENTARY METAL OXIDE SEMICONDUCTOR (BICMOS) DEVICE STRUCTURE

BACKGROUND OF THE INVENTION

1. Field of the Invention

The present invention relates generally to methods for fabricating BiCMOS device structures. More particularly, the present invention relates to methods for fabricating, with enhanced performance, BiCMOS device structures.

2. Description of the Related Art

Semiconductor integrated circuit microelectronic fabrications are formed from semiconductor substrates within and upon which are formed semiconductor devices, and over which are formed patterned conductor layers which are separated by dielectric layers.

As semiconductor integrated circuit microelectronic fabrication functionality and integration levels have increased, and semiconductor device dimensions have decreased, it has become more common in the art of semiconductor integrated circuit microelectronic fabrication to employ hybrid devices, such as in particular bipolar complementary metal oxide semiconductor (BiCMOS) devices, when fabricating semiconductor integrated circuit microelectronic fabrications. BiCMOS devices are desirable in the art of semiconductor integrated circuit microelectronic fabrication when fabricating semiconductor integrated circuit microelectronic fabrications insofar as BiCMOS devices often provide an optimal compromise of enhanced semiconductor device speed and reduced semiconductor device power consumption when operating semiconductor integrated circuit microelectronic fabrications.

While BiCMOS devices are thus desirable in the art of semiconductor integrated circuit microelectronic fabrication and often essential in the art of semiconductor integrated circuit microelectronic fabrication, BiCMOS devices are nonetheless not entirely without problems in the art of semiconductor integrated circuit microelectronic fabrication. In that regard, insofar as BiCMOS devices are generally fabricated employing more involved and complex semiconductor fabrication processes, BiCMOS devices are often not readily efficiently fabricated with optimized and enhanced performance.

It is thus desirable in the art of semiconductor integrated circuit microelectronic fabrication to provide methods and materials for fabricating BiCMOS devices with enhanced performance.

It is towards the foregoing object that the present invention is directed.

Various BiCMOS devices having desirable properties, and methods for fabrication thereof, have been disclosed in the art of semiconductor integrated circuit microelectronic fabrication.

Included among the BiCMOS devices and methods for fabrication thereof, but not limited among the BiCMOS devices and methods for fabrication thereof, are BiCMOS devices and methods for fabrication thereof disclosed within: (1) Lee, in U.S. Pat. No. 5,557,131 (a BiCMOS device and method for fabrication thereof having attenuated emitter contact to base contact leakage by forming within the BiCMOS device an emitter contact elevated with respect to a base contact); and (2) Ilderem et al., in U.S. Pat. No. 5,661,046 (a BiCMOS device and method for fabrication thereof having enhanced performance, by employing separate ion implants for forming a base region within a bipolar transistor device within the BiCMOS device and source/drain regions within a field effect transistor (FET) device within the BiCMOS device).

Desirable in the art of semiconductor integrated circuit microelectronic fabrication are additional methods which may be employed for forming BiCMOS devices with enhanced performance.

It is towards the foregoing object that the present invention is directed.

SUMMARY OF THE INVENTION

A first object of the present invention is to provide a method for fabricating a BiCMOS device.

A second object of the present invention is to provide a method in accord with the first object of the present invention, wherein the BiCMOS device is fabricated with enhanced performance.

A third object of the present invention is to provide a method in accord with the first object of the present invention and the second object of the present invention, wherein the method is readily commercially implemented.

In accord with the objects of the present invention, there is provided by the present invention a method for fabricating a bipolar transistor device.

To practice the method of the present invention, there is first provided a semiconductor substrate having formed therein a collector well having a collector contact region of a first polarity. There is then formed within the collector well a base well having a base contact region of a second polarity opposite the first polarity. There is also defined within the base well an emitter contact region for an emitter of the first polarity. There is then formed contacting the base contact region a polysilicon base contact of the second polarity and formed contacting the emitter contact region a polysilicon emitter contact of the first polarity. Finally, there is then implanted into the polysilicon base contact a dose of a dopant of the second polarity while masking the polysilicon emitter contact.

Within the present invention, the method for fabricating the bipolar transistor device may be extended to a method for fabricating a BiCMOS device having formed therein the bipolar transistor device.

The present invention provides a method for fabricating a BiCMOS device, wherein the BiCMOS device is fabricated with enhanced performance.

The present invention realizes the foregoing object by implanting into a polysilicon base contact of a bipolar transistor device which may be employed within the BiCMOS device a dose of a dopant while masking a polysilicon emitter contact of the bipolar transistor device which may be employed within the BiCMOS device.

The method of the present invention is readily commercially implemented.

The present invention employs methods and materials are generally known in the art of semiconductor integrated circuit microelectronic fabrication, but employed within the context of a specific process sequencing to provide the method of the present invention. Since it is thus at least in part a specific process sequencing which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for fabricating a BiCMOS device, wherein the BiCMOS device is fabricated with enhanced performance.

The present invention realizes the foregoing object by implanting into a polysilicon base contact of a bipolar transistor device which may be employed within the BiCMOS device a dose of a dopant while masking a polysilicon emitter contact of the bipolar transistor device which may be employed within the BiCMOS device.

Although the preferred embodiment of the present invention illustrates the present invention most particularly within the context of the commercially preferred embodiment of the present invention which employs a P+ silicon semiconductor substrate having formed thereupon a P− epitaxial layer, the present invention is also intended to encompass a less preferred embodiment employing a silicon semiconductor substrate and an epitaxial layer of opposite polarity.

Referring now to FIG. 1 to FIG. 6, there is shown a series of schematic cross-sectional diagrams illustrating the results of progressive stages of forming, in accord with a preferred embodiment of the present invention, a semiconductor integrated circuit microelectronic fabrication having fabricated therein a BiCMOS device.

Figure 1:
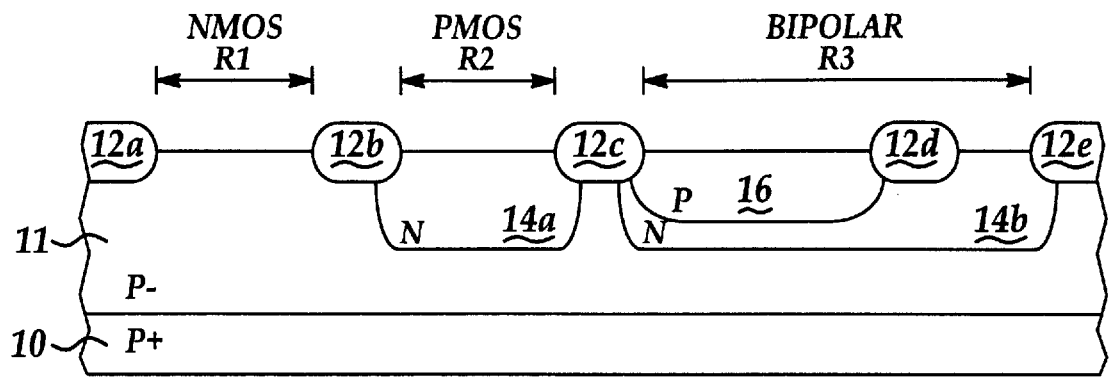
FIG. 1, FIG. 2, FIG. 3, FIG. 4, FIG. 5 and FIG. 6 show a series of schematic cross-sectional diagrams illustrating the results of progressive stages of forming, in accord with a preferred embodiment of the present invention, a semiconductor integrated circuit microelectronic fabrication having fabricated therein a BiCMOS device.

Shown in FIG. 1 is a schematic cross-sectional diagram of the semiconductor integrated circuit microelectronic fabrication at an early stage in its fabrication in accord with the preferred embodiment of the present invention.

Shown in FIG. 1, in a first instance, is a semiconductor substrate 10 having formed thereupon an epitaxial layer 11. Within the preferred embodiment of the present invention, and as is illustrated within the schematic cross-sectional diagram of FIG. 1, the semiconductor substrate 10 has a P+ dopant concentration, typically and preferably from about 1E15 to about 2E15 dopant atoms per cubic centimeter. Similarly, the semiconductor substrate 10 is a monocrystalline semiconductor substrate, typically and preferably a (100) monocrystalline silicon semiconductor substrate. As is also illustrated within the schematic cross-sectional diagram of FIG. 1, the epitaxial layer 11 has a P− dopant concentration, typically and preferably from about 1E15 to about 2E15 dopant atoms per cubic centimeter. Similarly, the epitaxial layer 11 is typically and preferably a (100) silicon epitaxial layer.

Shown also within the schematic cross-sectional diagram of FIG. 1 is a series of isolation regions 12a, 12b, 12c, 12d and 12e which in turn define a series of active regions of the epitaxial layer 11.

Although it is known in the art of semiconductor integrated circuit microelectronic fabrication that isolation regions may be formed employing methods including but not limited to isolation region thermal growth methods and isolation region deposition/patterning methods, for the preferred embodiment of the present invention, the series of isolation regions 12a, 12b, 12c, 12d and 12e is typically and preferably formed employing an isolation region thermal growth method to form the series of isolation regions 12a, 12b, 12c, 12d and 12e of silicon oxide having a thickness of from about 2500 to about 3500 angstroms which define the series of active regions of the epitaxial layer 11.

As is further illustrated within the schematic cross-sectional diagram of FIG. 1: (1) the active region R1 of the epitaxial layer 11 defined by the pair of isolation regions 12a and 12b is intended as an N-metal oxide semiconductor field effect transistor (N-MOSFET) device region of the epitaxial layer 11; (2) the active region R2 of the epitaxial layer 11 defined by the pair of isolation regions 12b and 12c is intended as a P-metal oxide semiconductor field effect transistor (P-MOSFET) device region of the epitaxial layer 11; and (3) the active regions R3 of the epitaxial layer 11 defined by the series of isolation regions 12c, 12d and 12e (which have an aggregate linewidth including the isolation region 12d of from about 1.0 to about 1.5 microns) are intended as bipolar transistor device regions of the epitaxial layer 11.

Finally, there is also illustrated within the schematic cross-sectional diagram of FIG. 1: (1) as formed within the epitaxial layer 11 and bounded by the pair of isolation regions 12b and 12c or 12c and 12e a pair of N doped wells 14a and 14b; and (2) as formed within the N doped well 14b and defined by the isolation regions 12c and 12d a P doped well 16.

Figure 2:
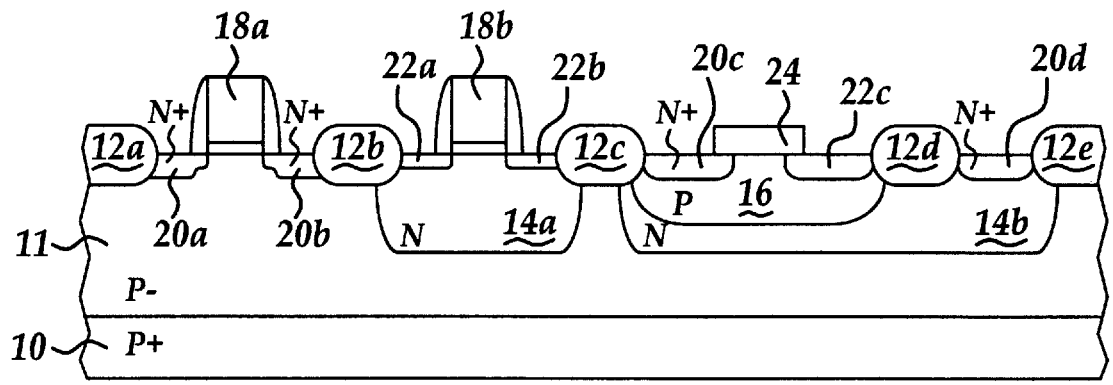

Within the preferred embodiment of the present invention, the pair of N doped wells 14a and 14b is formed by implant Sb dose of about 1.0E15 to about 3.0E15 dopant ions per square centimeter, while the P doped well 16 is formed by implant $BF_2$ dose of about 1.0E13 to about 5.0E13 dopant ions per square centimeter Referring now to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein, in a first instance, there is formed upon the active regions of the epitaxial layer 11 within the NMOS region R1 and the PMOS region R2 a corresponding pair of gate electrode stacks 18a and 18b.

Within the preferred embodiment of the present invention, the pair of gate electrode stacks 18a and 18b is intended as comprising: (1) a pair of gate dielectric layers formed upon the pair of active regions of the epitaxial layer 11, the pair of gate dielectric layers having formed aligned thereupon; (2) a pair of gate electrodes, both the pair of gate dielectric layers and the pair of gate electrodes having formed adjoining thereto; (3) two pair of spacer layers. Typically and preferably, the pair of gate dielectric layers is formed at least in part of a silicon oxide dielectric material formed to a thickness of from about 60 to about 80 angstroms upon the active regions of the epitaxial layer 11. Similarly, typically and preferably, the pair of gate electrodes is typically and preferably formed at least in part of a polysilicon gate material formed to a thickness of from about 2500 to about 3000 angstroms upon the pair of gate dielectric layers. Finally, typically and preferably, the two pair of spacer layers is formed of a silicon nitride material formed adjacent the pair of gate dielectric layers and the gate electrode while employing an anisotropic etching method.

Shown also within the schematic cross-sectional diagram of FIG. 2 is a dielectric separation layer 24 formed upon the active region of the epitaxial layer 11 as defined by the pair of isolation regions 12c and 12d, and further defining therefrom two active sub-regions. Within the preferred embodiment of the present invention, the active sub-region adjoining the isolation region 12c serves as an emitter contact region within the bipolar transistor device region R3 and the active sub-region adjoining the isolation region 12d serves as a base contact region within the bipolar transistor device region R3. Within the preferred embodiment of the present invention, the dielectric separation layer 24 is typically and preferably formed at least in part of a silicon oxide dielectric material formed to a thickness of from about 2000 to about 3000 angstroms and a linewidth of from about 0.3 to about 0.8 microns, and intended to further divide the active region of the epitaxial layer 11 defined by the pair of isolation regions 12c and 12d into the two active sub-regions.

Shown also within the schematic cross-sectional diagram of FIG. 2 is a series of N+ doped regions 20a, 20b, 20c and 20d formed into various of the active regions of the epitaxial layer 11, where: (1) the N+ doped regions 20a and 20b serve as a pair of source/drain regions within an N-metal oxide semiconductor field effect transistor (N-MOSFET) device formed within the NMOS region R1; (2) the N+ region 20c serves as an optional emitter region within the P doped well 16; and (3) the N+ region 20d serves as a collector contact within the N doped well 14b. Each of the foregoing N+ doped regions is formed employing an ion implantation method as is conventional in the art of semiconductor integrated circuit microelectronic fabrication, to provide the series of N+ doped regions 20a, 20b, 20c and 20d of N+ dopant concentration from As to a concentration from about 1.0E15 to about 5.0E15 dopant atoms per cubic centimeter.

Finally, there is also shown within the schematic cross-sectional diagram of FIG. 2 a series of P doped regions 22a, 22b and 22c, where: (1) the P doped regions 22a and 22b serve as a pair of lightly doped drain (LDD) extension regions within the P-metal oxide semiconductor field effect transistor (P-MOSFET) device formed within the PMOS region R2; and (2) the P doped region 22c within the P doped well 16 serves as an optional P contact region.

Within the preferred embodiment of the present invention, the series of P doped regions 22a, 22b and 22c is formed via ion implantation of $BF_2$ at a dopant concentration of from about 1.0E15 to about 5.0E15 dopant atoms per cubic centimeter.

Figure 3:
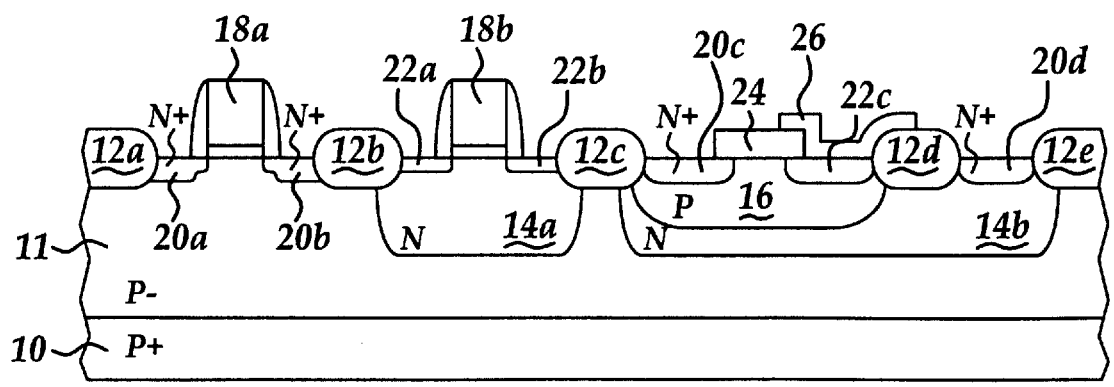

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2, but wherein there is formed contacting the P doped region 22c within the P doped well 16 which comprises a base within a bipolar transistor device, and spanning from the dielectric separation layer 24 to the isolation region 12d, a patterned polysilicon base contact layer 26.

Within the preferred embodiment of the present invention, the patterned polysilicon base contact layer 26 may be formed employing deposition and lithographic etch methods as are otherwise conventional in the art of semiconductor integrated circuit microelectronic fabrication, to provide the patterned polysilicon base contact layer 26 of thickness from about 1500 to about 2000 angstroms. Typically and preferably, the patterned polysilicon base contact layer 26 has incorporated therein a P dopant from $BF_2$ at a concentration of from about 1.0E14 to about 5.0E14 dopant atoms per cubic centimeter.

Figure 4:
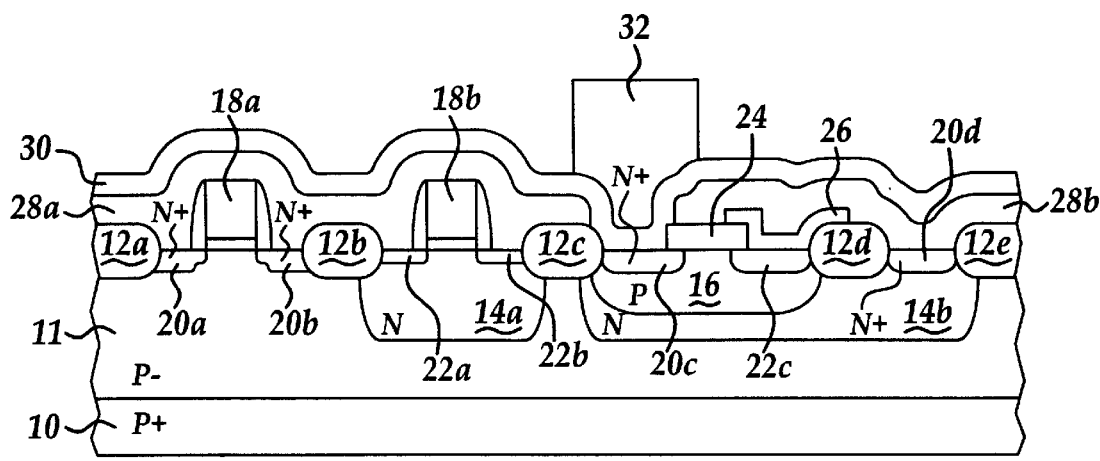

Referring now to FIG. 4, there is shown a schematic cross-sectional diagram illustrating the results of further processing of the semiconductor integrated circuit microelectronic fabrication whose schematic cross-sectional diagram is illustrated in FIG. 3.

Shown in FIG. 4 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein, in a first instance, there is formed upon the semiconductor integrated circuit microelectronic fabrication a pair of patterned pre-metal dielectric (PMD) layers 28a and 28b which leave exposed the N+ doped region 20c which serves as the optional emitter region within the bipolar transistor device.

Within the preferred embodiment of the present invention, the pair of patterned pre-metal dielectric (PMD) layers 28a and 28b is typically and preferably formed at least in part of a silicon oxide dielectric material, typically and preferably formed to a thickness of from about 10000 to about 15000 angstroms.

Shown also within the schematic cross-sectional diagram of FIG. 4, and formed upon the pair of patterned pre-metal dielectric (PMD) layers 28a and 28b and contacting the N+ doped region 20c which comprises the emitter region is a blanket polysilicon emitter contact layer 30 in turn having formed thereupon a patterned photoresist layer 32 intended to serve as an etch mask layer for forming a patterned polysilicon emitter contact layer from the blanket polysilicon emitter contact layer 30.

Within the preferred embodiment of the present invention, the blanket polysilicon emitter contact layer 30 is typically and preferably formed of a polysilicon material having incorporated therein an N+ dopant From As at a concentration of from about 1.0E16 to about 5.0E16 dopant atoms per cubic centimeter.

Similarly, within the preferred embodiment of the present invention with respect to the patterned photoresist layer 32, the patterned photoresist layer 32 may be formed of photoresist materials as are other wise generally conventional in the art of semiconductor integrated circuit microelectronic fabrication.

Figure 5:
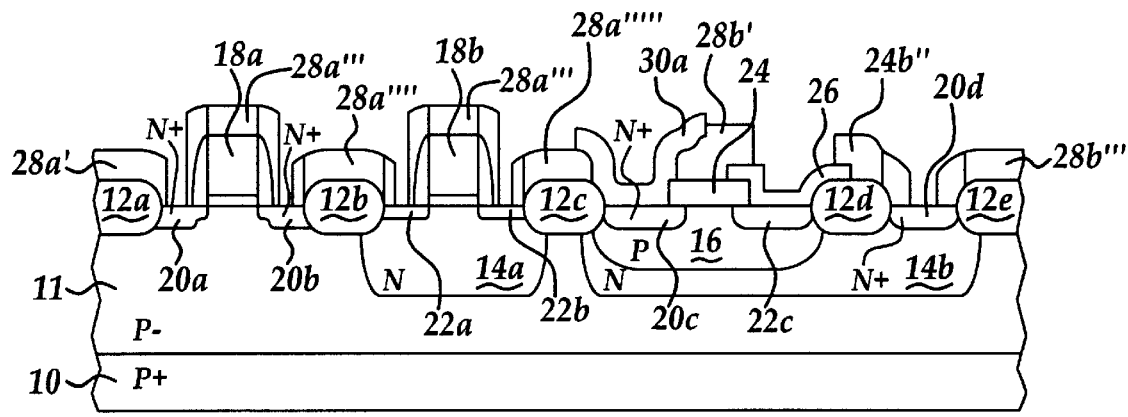

Referring now to FIG. 5, there is shown a schematic cross-sectional diagram illustrating the results of further processing of the semiconductor integrated circuit microelectronic fabrication whose schematic cross-sectional diagram is illustrated in FIG. 4.

Shown in FIG. 5 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 4, but wherein, in a first instance, the blanket polysilicon emitter contact layer 30 has been patterned to form a patterned polysilicon emitter contact layer 30a, while employing the patterned photoresist layer 32 as an etch mask layer. Similarly, and as is also illustrated within the schematic cross-sectional diagram of FIG. 5, the patterned photoresist layer 32 is then stripped from the semiconductor integrated circuit microelectronic fabrication whose schematic cross-sectional diagram is illustrated in FIG. 4 to provide in part the semiconductor integrated circuit microelectronic fabrication whose schematic cross-sectional diagram is illustrated in FIG. 5.

The foregoing etching of the blanket polysilicon emitter contact layer 30 to form the patterned polysilicon emitter contact layer 30a, and subsequent stripping of the patterned photoresist layer 32 therefrom, may be undertaken employing methods and materials as are conventional in the art of semiconductor integrated circuit microelectronic fabrication.

Finally, there is also shown within the schematic cross-sectional diagram of FIG. 5 an additional patterning of the pair of patterned pre-metal dielectric (PMD) layers 28a and 28b to form a series of twice patterned pre-metal dielectric (PMD) layers 28a', 28a'', 28a''', 28a'''', 28a''''', 28b', 28b'' and 28b''', which leave exposed the N+ doped regions 20a, 20b and 20d, the P doped regions 22a and 22b, and the patterned polysilicon base contact layer 26.

Within the preferred embodiment of the present invention, the pair of patterned pre-metal dielectric (PMD) layers 28a and 28b may be patterned to form the foregoing series of twice patterned pre-metal dielectric (PMD) layers while employing photolithographic and etch methods as are otherwise generally conventional in the art of semiconductor integrated circuit microelectronic fabrication.

Figure 6:
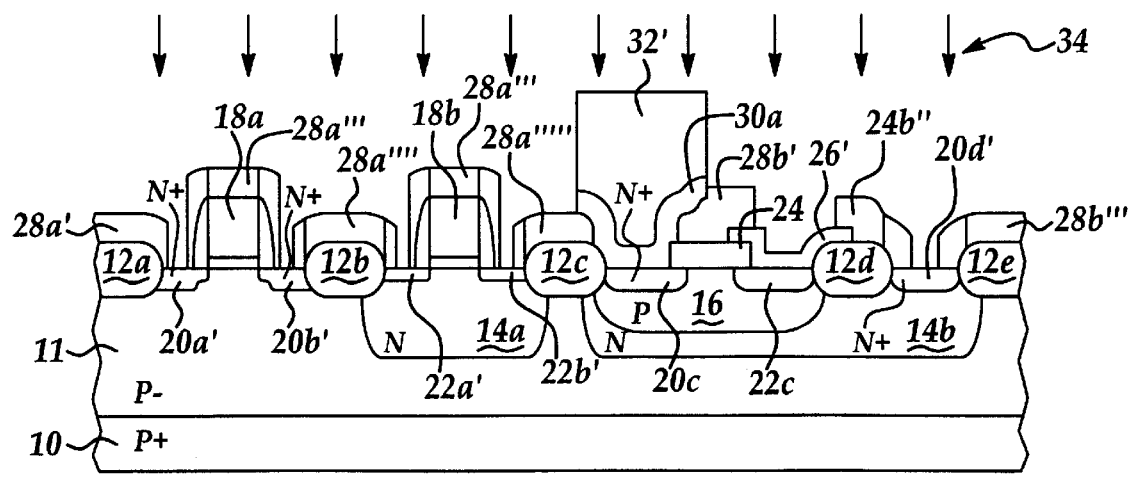

Referring now to FIG. 6, there is shown a schematic cross-sectional diagram illustrating the results of further processing of the semiconductor integrated circuit microelectronic fabrication whose schematic cross-sectional diagram is illustrated in FIG. 5.

Shown in FIG. 6 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 5, but wherein, in a first instance, there is formed a second patterned photoresist layer 32' upon the patterned polysilicon emitter contact layer 30a.

Within the preferred embodiment of the present invention, the second patterned photoresist layer 32' is otherwise analogous or equivalent to the first patterned photoresist layer 32, and it is formed employing the same photomask, but may be offset somewhat with respect to the patterned polysilicon emitter contact layer 30a incident to a photolithographic mis-registration.

Finally, there is also shown within the schematic cross-sectional diagram of FIG. 6 a dose of P+ implanting ions implanted into: (1) the series of N+ doped regions 20a, 20b and 20d to form a series of N+ retro-doped regions 20a', 20b' and 20d'; (2) the pair of P doped regions 22a and 22b to form a pair of P+ doped regions 22a' and 22b' which form a pair of source/drain regions within the P-metal oxide semiconductor field effect transistor (P-MOSFET) device formed within the PMOS region R2; and (3) the patterned polysilicon base contact layer 26 to form a P+ implanted patterned polysilicon base contact layer 26'.

As is understood by a person skilled in the art, the dose of P+ implanting ions 34 as illustrated within the schematic cross-sectional diagram of FIG. 6 is provided (preferably while masking only the patterned polysilicon emitter contact layer 30a) such as to provide a dopant concentration from $BF_2$ of from about 5.0E14 to about 9.0E14 dopant atoms per cubic centimeter, such that there is minimal compromise of the series of N+ doped regions 20a, 20b and 20d when forming the series of retro-doped N+ doped regions 20a', 20b' and 20d'. Similarly, as is also understood by a person skilled in the art, the dose of P+ implanting ions 34 provides for a reduction of base contact resistance with respect to the patterned polysilicon base contact layer 26, and thus enhanced performance of the bipolar transistor device within the semiconductor integrated circuit microelectronic fabrication whose schematic cross-sectional diagram is illustrated in FIG. 6. Such enhanced performance is effected while not compromising performance of the metal oxide semiconductor field effect transistor (FET) devices within the BiCMOS device whose schematic cross-sectional diagram is illustrated in FIG. 6.

EXAMPLE

In order to illustrate the value of the present invention, there was fabricated two semiconductor integrated circuit microelectronic fabrications generally in accord with the schematic cross-sectional diagram of FIG. 5, while employing process parameters and methodology in accord with the preferred embodiment of the present invention.

One of the two semiconductor integrated circuit microelectronic fabrications received no further treatment. The other of the semiconductor integrated circuit microelectronic fabrications was masked in accord with the schematic cross-sectional diagram of FIG. 6 (i.e., only a patterned polysilicon emitter contact layer was masked) and ion implanted while employing a dose of $BF_2$ dopant ions at an ion implantation dose of about 5.0E14 to about 9.0E14 dopant ions per square centimeter and an ion implantation energy of about 40 kev to provide within a patterned polysilicon base contact layer a $BF_2$ dopant concentration.

There was then measured for each of the two semiconductor integrated circuit microelectronic fabrications: (1) patterned polysilicon base contact layer contact resistances (Rc-BPLY)); (2) base effective RF resistances (Rb); and (3) N+ source/drain contact resistances (Rc-N+S/D), while employing methods as are conventional in the art of semiconductor integrated circuit microelectronic fabrication. Results of the measurements are reported in Table I, as follows.

TABLE I

|  | Rc-BPLY | RF Rb | Rc-N + S/D |
| --- | --- | --- | --- |
| No P+ Implant | 131 ohm | 436 ohm | 37 ohm |
| With P+ Implant | 88 | 390 | 45 |

As is seen from review of the data within Table I, the method of the present invention provides for a considerable reduction of patterned polysilicon base contact layer contact resistance and effective RF base resistance within a bipolar transistor device within a BiCMOS device, while marginally compromising N+ source/drain contact resistance within an N-metal oxide semiconductor field effect transistor (N-MOSFET) device within the BiCMOS device.

As is understood by a person skilled in the art, the preferred embodiment and example of the present invention are illustrative of the present invention rather than limiting of the present invention. Revisions and modifications may be made to methods, materials, structures and dimensions with respect to a semiconductor integrated circuit microelectronic fabrication in accord with the preferred embodiment of the present invention, while still fabricating a semiconductor integrated circuit microelectronic fabrication in accord with the present invention, further in accord with the accompanying claims.

What is claimed is:

1. A method for fabricating a bipolar transistor device comprising:

providing a semiconductor substrate having formed therein a collector well having a collector contact region of a first polarity;

forming within the collector well a base well having a base contact region of a second polarity opposite the first polarity;

defining within the base well an emitter contact region for an emitter of the first polarity;

forming contacting the base contact region a polysilicon base contact of the second polarity and forming contacting the emitter contact region a polysilicon emitter contact of the first polarity; and implanting into the polysilicon base contact a dose of a dopant of the second polarity while masking the polysilicon emitter contact.

2. The method of claim 1 wherein the semiconductor substrate is a silicon semiconductor substrate.

3. The method of claim 1 wherein the first polarity in an N polarity and the second polarity is a P polarity.

4. The method of claim 1 wherein the first polarity is a P polarity and the second polarity is an N polarity.

5. The method of claim 1 wherein the dose of the dopant of the second polarity is provided by $BF_2$ to yield a dopant concentration of from about 5.0E14 to about 9.0E14 dopant atoms per cubic centimeter within the polysilicon base contact.

6. The method of claim 1 wherein the polysilicon base contact is implanted while masking the polysilicon emitter contact but not the collector contact region.

7. The method of claim 1 wherein polysilicon base contact is masked employing a patterned second photoresist layer formed employing a single photomask which is first employed for forming a patterned first photoresist layer employed for defining the polysilicon base contact from a blanket polysilicon base contact layer.

8. A method for fabricating a BiCMOS device comprising:

providing a semiconductor substrate having formed therein an N-MOSFET device region, a P-MOSFET device region and a bipolar transistor device region, the bipolar transistor device region comprising:

a collector well having a collector contact region of a first polarity;

a base well formed within the collector well and having a base contact region of a second polarity opposite the first polarity;

an emitter contact region defined within the base well for an emitter of the first polarity;

forming contacting the base contact region a polysilicon base contact of the second polarity and forming contacting the emitter contact region a polysilicon emitter contact of the first polarity; and implanting into the polysilicon base contact a dose of a dopant of the second polarity while masking the polysilicon emitter contact.

9. The method of claim 8 wherein the semiconductor substrate is a silicon semiconductor substrate.

10. The method of claim 8 wherein the first polarity in an N polarity and the second polarity is a P polarity.

11. The method of claim 8 wherein the first polarity is a P polarity and the second polarity is an N polarity.

12. The method of claim 8 wherein the dose of the dopant of the second polarity is provided by $BF_2$ to yield a dopant concentration of from about 5.0E14 to about 9.0E14 dopant atoms per cubic centimeter within the polysilicon base contact.

13. The method of claim 8 wherein the polysilicon base contact is implanted while masking the polysilicon emitter contact but neither:

the collector contact region;

a pair of source/drain regions within the N-MOSFET device region; nor a pair of source/drain regions within the P-MOSFET device region.

14. The method of claim 8 wherein polysilicon base contact is masked employing a patterned second photoresist layer formed employing a single photomask which is first employed for forming a patterned first photoresist layer employed for defining the polysilicon base contact from a blanket polysilicon base contact layer.

* * * * *